US007026803B2

(12) United States Patent
Kurth

(10) Patent No.: US 7,026,803 B2
(45) Date of Patent: Apr. 11, 2006

(54) HAND-HELD, ERGONOMIC CAPACITIVE AMPLIFIER AND HAND-HELD TONE GENERATOR TO BE USED IN CONJUNCTION WITH THE CAPACITIVE AMPLIFIER

(76) Inventor: Michael Kurth, Friedrichstr 140, 72800, Eningen u.A. (DE)

( * ) Notice: Subject to any disclaimer, the term of this patent is extended or adjusted under 35 U.S.C. 154(b) by 151 days.

(21) Appl. No.: 10/673,666

(22) Filed: Sep. 30, 2003

(65) Prior Publication Data

US 2004/0135570 A1 Jul. 15, 2004

Related U.S. Application Data

(60) Provisional application No. 60/414,933, filed on Sep. 30, 2002, provisional application No. 60/414,934, filed on Sep. 30, 2002, provisional application No. 60/415,128, filed on Sep. 30, 2002.

(51) Int. Cl.
*G01R 19/00* (2006.01)

(52) U.S. Cl. ........................................ 324/66; 379/21

(58) Field of Classification Search ................. 324/66, 324/67; 379/21
See application file for complete search history.

(56) References Cited

U.S. PATENT DOCUMENTS

| | | | | |
|---|---|---|---|---|
| 4,506,210 A * | 3/1985 | Chase | ........................ | 324/66 |
| 4,998,059 A * | 3/1991 | Nigon et al. | .................. | 324/67 |
| 5,577,099 A * | 11/1996 | Clement et al. | .............. | 379/21 |
| 5,703,928 A * | 12/1997 | Galloway et al. | ............. | 379/21 |
| 5,909,113 A * | 6/1999 | Clement et al. | .............. | 324/66 |
| 6,163,504 A * | 12/2000 | Komninos et al. | .......... | 367/135 |
| 6,452,397 B1 * | 9/2002 | Ott et al. | .................... | 324/327 |

* cited by examiner

*Primary Examiner*—Anjan Deb
*Assistant Examiner*—Timothy J. Dole

(57) ABSTRACT

A capacitive amplifier and tone generator detect and amplify an electrical tone conducted by one of a group of wires or a pair of wires in order to identify and trace a particular wire or pair of wires. The capacitive amplifier has a probe for being placed adjacent a wire under test, an input terminal coupled to the conductive probe for receiving an input signal therefrom, a suppression unit coupled to the input terminal for receiving the input signal and for suppressing the noise signals, and an amplifier coupled to the suppression unit to amplify the noiseless output signal. The suppression unit can include an analog/digital converter, a digital/analog converter, a CPU and a memory for suppressing noise frequencies contained in the digital signal values by subtracting from the input signal a time-delayed signal wherein a time-delay period corresponds to a period of the unwanted noise frequency.

11 Claims, 2 Drawing Sheets

HAND-HELD, ERGONOMIC CAPACITIVE AMPLIFIER AND HAND-HELD TONE GENERATOR TO BE USED IN CONJUNCTION WITH THE CAPACITIVE AMPLIFIER

This application claims priority from provisional applications: 60/414,933 filed Sep. 30, 2002, 60/414,934 filed Sep. 30, 2002, and 60/415,128 filed Sep. 30, 2002.

BACKGROUND OF THE INVENTION

1. Field of the Invention

The present invention relates in general to capacitive amplifiers used to identify and trace a particular wire within a group of wires, and more particularly, to a capacitive amplifier having a suppression unit for suppressing unwanted noise signals. The present invention relates also to a tone generator for use in conjunction with the capacitive amplifier.

2. Description of the Relevant Art

Capacitive amplifiers or electric field tone detectors are used by telecommunications, data, alarm or electric service personnel to identify and trace cables in a bundle of cables or inside or behind walls or trace and identify pairs of wires in a bundle of pairs of wires without the need for punctuation, de-insulation or damaging the insulation of the particular wire. These capacitive amplifiers are used in conjunction with low frequency tone generators, also called toners. The toner has to be connected on the known side of the cable or wire pair to inject the tone frequency into the particular wire pair or cable.

The probe tip of the capacitive amplifier has to be moved over the cable or bundle of wire pairs or along a wall to identify the particular connected wire pair conducting the injected audio tone or the cable itself. In this way the cable path or the right pair can be separated from the others. The capacitive amplifier typically includes a built-in loudspeaker which is located opposite the probe tip and which can be used to produce an audible signal derived from the injected audio tone. In addition, terminals may be provided for allowing a rugged service telephone handset, or buttset, to be attached to the capacitive amplifier to reproduce the detected audible tones in the earphone of the buttset.

The normal use of much capacitive amplifiers may, however, be obstructed by noisy environments from power lines or different Linda of electrical devices. Electrical power is provided as an alternating current signal having a frequency of 50 or 60 Hz and for example in areas where power distribution panels for a building are located a power line hum is present which is composed of a 50 or 60 Hz signal plus harmonics thereof. Such noisy signals can be unwantedly picked up by the probe tip and are often much greater than the amplitude of the signal output by the tone generator. Thus finding the location of the desired pair of wires of the desired signal cable is difficult.

Accordingly, it is an object of the present invention to provide a capacitive amplifier adapted to amplify the tone signals provided by a tone generator while suppressing noise signals present in a noisy environment.

It is another object of the present invention to provide a tone generator for use in conjunction with the above capacitive amplifier and for providing tone signals to be detected and amplified by the capacitive amplifier.

SUMMARY OF THE INVENTION

The present invention provides a capacitive amplifier for detecting and amplifying an electrical tone conducted by one of a group of wires in order to identify and trace a particular wire, the capacitive amplifier suppressing noise signals having a predetermined fundamental noise frequency and suppressing noise signals having frequencies that are harmonics of said predetermined fundamental noise frequency, wherein said capacitive amplifier comprises a probe for being placed adjacent a wire under test, an input terminal coupled to the probe for receiving an input signal therefrom, a suppression unit coupled to the input terminal for receiving the input signal and for suppressing said noise signals, and an amplifier coupled to the suppression unit to amplify the noiseless output signal.

In one preferred embodiment said suppression unit is arranged for receiving the input signal and for providing a time-delayed signal of the input signal and to subtract the time-delayed signal from the input signal, wherein the time-delayed signal is delayed by a delay period substantially equal to the inverse of the noise frequency to be suppressed or an integer multiple thereof.

In one further preferred embodiment said suppression unit comprises an analog to-digital (A/D) converter coupled to the input terminal for converting the input signal into a digital signal, a memory coupled to said A/D converter for storing digital input signal values, a subtraction unit for receiving time-delayed digital signal values from said memory and for subtracting time-delayed digital signal values from digital signal values, and a digital-to-analog (D/A) converter coupled to said subtraction unit.

In one further preferred embodiment said subtraction unit is part of a central processing unit (CPU) or its function are conducted by said CPU and said CPU is arranged for reading out said digital signal values from said memory after a storage time, said storage time being identical with the delay time, and for subtracting these time-delayed digital signal values from actual input digital signal values.

By setting the storage time of digital signal values in the CPU the unwanted frequency and their harmonics can he adjusted. Therefore, the noise suppression can be programmed by software. With this scheme it is also possible to detect the existence of any specific frequency in the input signal and to indicate the existence or non-existence with LED's on the unit housing.

In another preferred embodiment said capacitive amplifier further includes a high pass filter coupled to said input terminal. In this embodiment said high pass filter is preferably comprised of a differential amplifier, wherein the positive input port of said differential amplifier is coupled to said input terminal and the negative input port of said differential amplifier is coupled to the output of a low pass filter and the input of said low pass filter is coupled to said input port. The cut-off frequency of said low pause filter is preferably about 300 Hz.

In one further preferred embodiment said high pass filter is part of a preamplifier stage comprising a preamplifier and said high pass filter.

In another further preferred embodiment said capacitive amplifier further includes a volume tuning section coupled to said input terminal, wherein said volume tuning section comprises a digital potentiometer and a push button section for switching on said capacitive amplifier and for actuating said digital potentiometer. In a preferred embodiment thereof said push button section comprises a push button and three electrical contacts arranged in a line such that by pressing the push button the middle contact is closed (by pressing it on a printed wire line) and the capacitive amplifier is switched on thereby and by shifting the pressed push button in the forward or the backward direction the front or the back contact is additionally actuated and the digital potentiometer is thereby controlled to increase or to reduce the signal level.

In another preferred embodiment said capacitive amplifier further includes a probe with an electrically non-conductive probe tip, preferably made of carbon fiber or anodized aluminum, so that at least the surface of the probe tip is electrically non-conducive or high-resistive. The probe tip can therefore be metallic or quasi-metallic while being electrically non-conductive or having an electrically non-conductive surface. Thus the probe tip comprises a good mechanical stability and good electrical isolation properties.

The present invention provides also a tone generator for use in conjunction with a capacitive amplifier according to the above, wherein said tone generator comprises a 4 position slide switch for selecting between the modes square wave, sine wave, continuity and talking mode, wherein in the square wave mode the tone signal is output as a square wave signal, in a sine wave mode the tone signal is output as a sine wave signal, in the continuity mode the continuity of any conductor, circuit or electronic part can be tested, and in the talking mode a specified DC voltage can be delivered.

Figure 1:
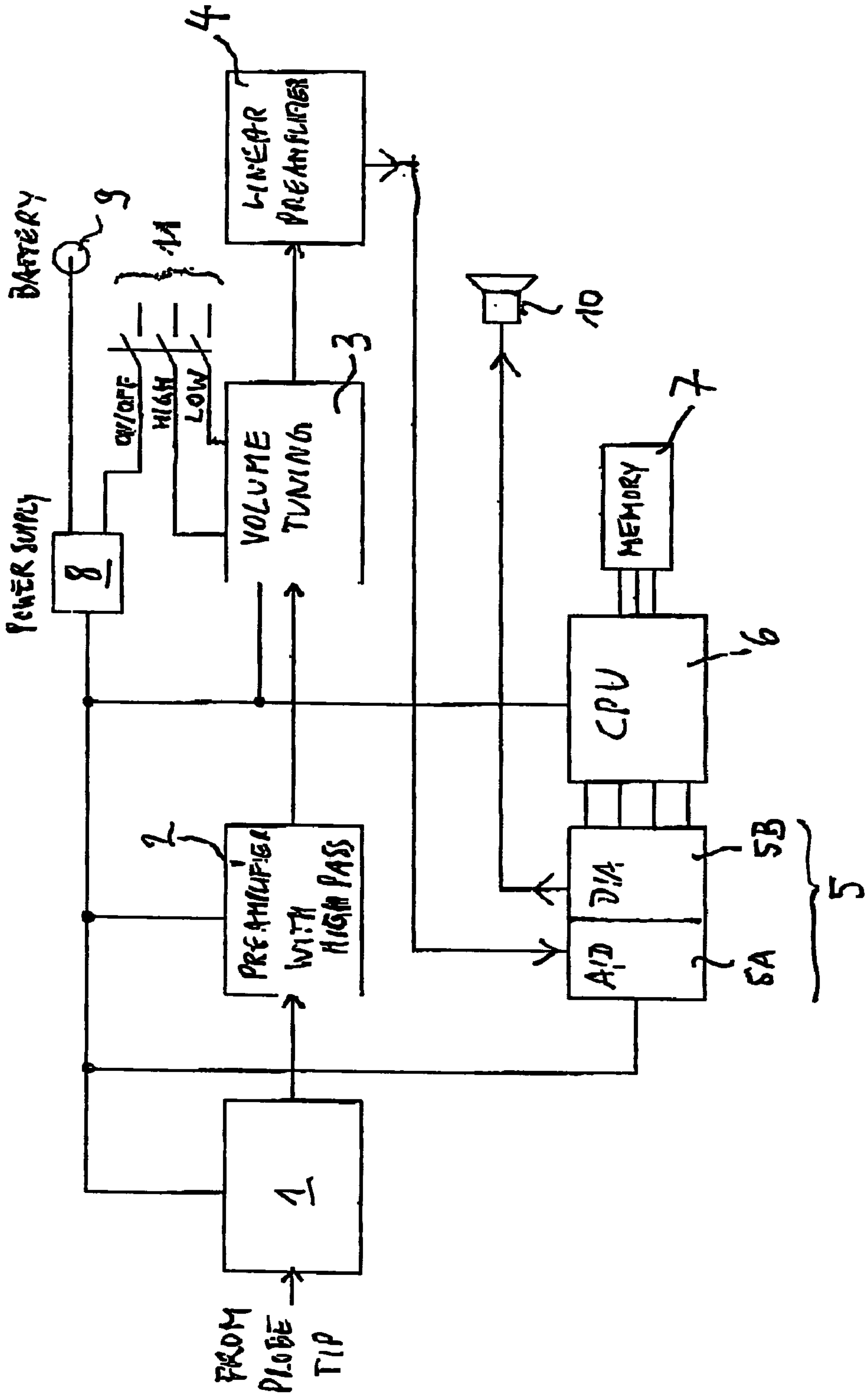
FIG. 1 is a schematic block-diagram of a capacitive amplifier according to an embodiment of the invention.

According to FIG. 1 a signal emerging from a wire or a wire pair is coupled into a probe tip of the capacitive amplifier and is coupled into a high impedance input stage 1 and amplified by a high sensitive FET amplifier. An over-voltage protection is coupled to the input of the amplifier. The probe tip can be made of carbon filter material or from anodized aluminum.

Figure 2:
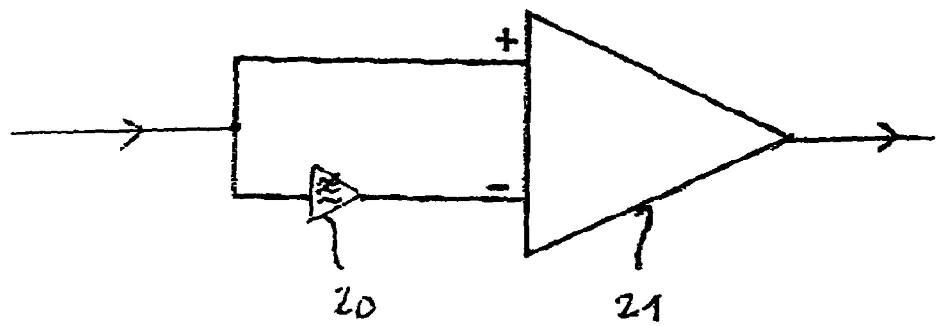
FIG. 2 an embodiment of the high pass filter.

The output of the high impedance input stage 1 is coupled into a preamplifier stage 2 having contained therein a high pass filter. The high pass filter is depicted in FIG. 2. The signal is divided and input into a differential amplifier 21. The positive input of the differential amplifier 21 receives the unchanged signal whereas the negative input of the differential amplifier 21 receives the signal which has passed through a low pass filter 20 having a cut-off frequency of about 300 Hz. This results in a strong attenuation of the fundamental 50/60 Hz frequency up to −60 dB.

Figure 3:
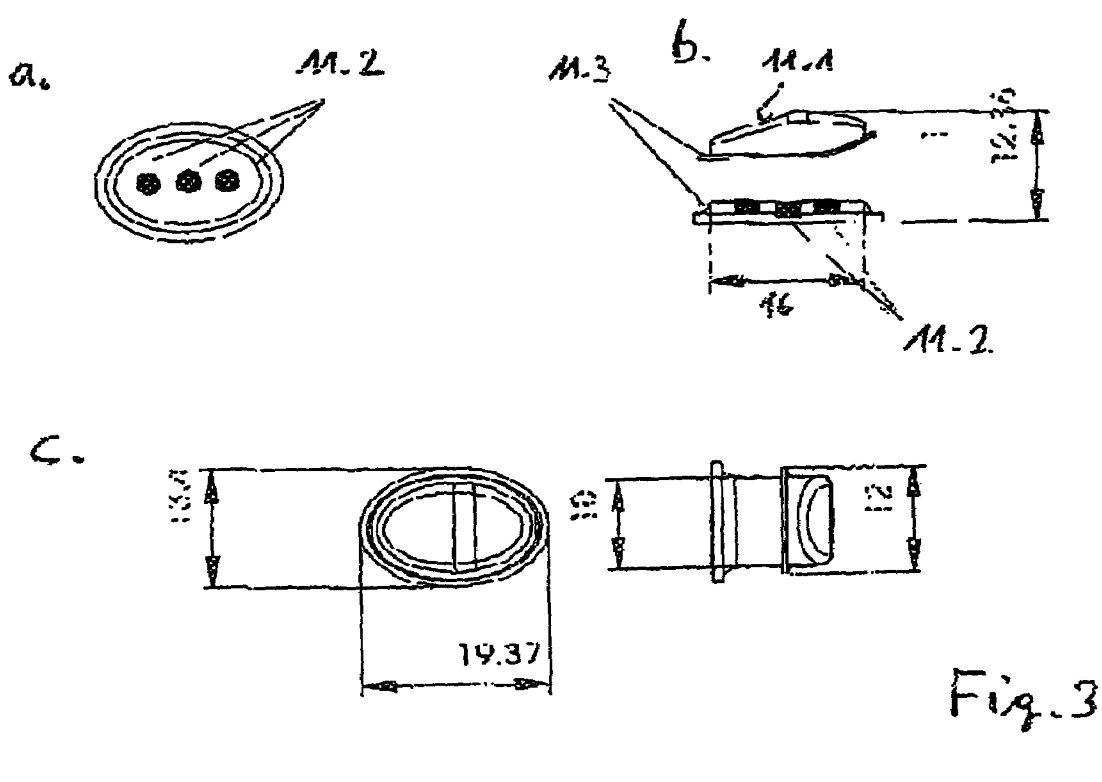
FIGS. 3*a, b, c* an embodiment of the push button section showing the three contacts in a top view (a), the would push button section in a side view (b), and the push button section in a top view and a front side view (c).

The output of the preamplifier stage 2 is input into a volume tuning section 3. In the volume tuning section 3 the sensitivity (volume) can be increased or decreased by the user. The volume tuning section 3 comprises a digital potentiometer which can be actuated by means of a push button section 11. The push button section 11 is depicted in more detail in FIG. 3. As can be seen in FIG. 3*b,* the push button section has three contact fields made of conductive carbon rubber. The middle contact is about 0.5 mm longer than the others. Therefore, only this middle contact is closed if the push button 11.1 is pressed down. Below the electrical contacts 11.2 are formed metallic printed wires on a PCB board. The rubber membranes 11.3 serve for a tilting movement when actuating the push button 11.1. The capacitive amplifier is switched on by pressing the push button 11.1 downwards thus making contact between the middle contact and a printed wire-line on the PCB board. By holding and moving the push button 11.1 in the front direction the front contact is additionally closed. This is used to increase the sensitivity by means of the digital potentiometer, i.e. increasing the signal level. By moving the push button 11.1 backwards the sensitivity can be decreased. As long as the push button 11.1 is pressed down, the unit will stay in the ON position. After release of the push button 11.1, the volume position will be stored and the unit will switch off. In another version the middle contact has a toggle function. By pressing the push button 11.1 down, the unit will be switched on and stay in the ON position for around 4–5 minutes. After this time the unit is switched off. If during the ON time the push button 11.1 is pressed down and released in a time frame of 1 second, the unit also switched off.

On the housing of the capacitive amplifier a light indicator is mounted in the form of an LED bar containing 5 red LED's. This LED's are mounted in a row to indicate also the sensitivity position of the digital potentiometer.

The output of the volume tuning section 3 is then input into a linear preamplifier 4.

The output of the linear preamplifier 4 is input into An A/D- and D/A-conversion unit 5. The signal it first input into an analog/digital (A/D) converter 5A for converting the analog signals into digital signal values with a 13 bit revolution. These digital signal values are then stored in a memory 7 by control of a central processing unit (CPU) 6. The A/D- and D/A conversion unit 5, the CPU 6 and the memory 7 form together a suppression unit for suppressing noise frequencies contained in the analog signal as delivered from the linear preamplifier 4. For this purpose subtraction operations are carried out in the CPU 6. The analog signal is sampled in the A/D converter 5A with a rate of 0 kHz. The digital signal values than will be stored in the memory 7. The digital signal values are stored for a time which corresponds to the time period of the noise frequency to be suppressed. This means 20 ms for 50 Hz and harmonic frequency thereof, and 16 ms for 60 Hz and harmonic frequencies thereof. By changing the storing time, the result can be changed to nearly any frequency. After the storing time the stored signal will be compared in the CPU 6 with the streaming, unstored digital signal values and both signals are subtracted from each other. The result is for example a data stream without the 50/60 Hz frequencies and all harmonic frequencies thereof. The subtraction resolution is 1 Hz. The subtraction results are then delivered to the D/A converter 5B and are changed back to an analog signal. In the D/A converter 5B there can be included also a power amplifier to drive a loudspeaker 10 to make the signal audible.

The unit also contains an earphone jack to connect an earphone The jack switches automatically the unit on. This means that as long as the user needs the earphone the probe can be used without the need to push the ON push button 11.1.

The above described capacitive amplifier can be used in conjunction with a hand-held, battery powered tone generator which contains a micro-processor and which has four different high precise frequencies, two solid tones and two alternating tone combinations and low battery indication. The device comprises also a visible "ON" indication as well as selectable square wave and sine wave output. The ON indication is realized by translucent silicon rubber buttons for the solid and alternate mode, respectively. If the solid mode is on, the whole button lights up and gives a very good visible indicator—even from a big distance. The unit has an automatic shut-off after 45 minutes. To have more working time there is also an automatic shut-off override. There is an additional rubber button to switch the unit OFF by pressing one button. The signal output is symmetric, terminated with 600–1200 Ohms and over voltage protected up to 380 V AC in any mode. After switching the unit on by pressing the SOL or ALT button the built in piezo transducer sounds for a second the transmitted frequency. The output level is selectable by a 2-position slide switch from 9 V pp to 18 V pp. A 4-position slide switch allows selecting the mode square wave, sine wave, continuity and talking mode. In the continuity mode the unit allows to test the continuity of any conductor, circuit or electronic part up to 100 Ohms. The current through the circuit will never be higher as 0.6 mA. This prevents any circuit not to be damaged. In the talking mode the unit delivers a "line" voltage of 18 V DC and a maximum current of 10 mA to drive any test telephone on a deadline. The special talk circuit is high ohmic to the voice-band frequencies so that they are not shorted. With this circuit it is possible to drive two or more test telephones on a deadline to establish a "party-line" for the technicians.

The tone generator is connected by two leads with clips or by a plug (depending on country) on the known and of the cable. In the continuity mode the user can first check whether there is a short circuit between the lines. If there is no short the user can switch on the trace signal, sine wave or square wave. The sine wave mode protects the other services on the cable. If it is a long loop or a low ohmic termination, the output level can be changed up to 18 V to have enough signals to find the cable or wire. The tracing of the cable path is done with the above described capacitive amplifier.

The tone generator is light weight and easy to use because of the clear and logic construction. It is easy to select the mode with the help of the slide switch with 4-positions, square wave, sine wave, continuity and talking mode. To change the output level there is a 2-position slide switch having the positions low and high. To change the kind of output signal there are two buttons with LED indicator for solid tone and alternating tone. Therefore without changing the level and mode, the unit can be switched on and off again. This is very time saving as it can be seen every time what mode and volume is selected.

What is claimed is:

1. A capacitive amplifier for detecting and amplifying an electrical tone conducted by one of a group of wires in order to identify and trace a particular wire, the capacitive amplifier suppressing noise signals having a predetermined fundamental noise frequency and suppressing noise signals having frequencies that are harmonics of said predetermined fundamental noise frequency, said capacitive amplifier comprising:

a probe for being placed adjacent a wire under test;

an input terminal, coupled to the conductive probe, for receiving an input signal therefrom;

a suppression unit, coupled to the input terminal, for receiving the input signal and for suppressing said noise signals, said suppression unit comprising an analog-to-digital (AD) converter, coupled to the input terminal, for converting the input signal into a digital signal;

a memory, coupled to said A/D converter, for storing digital signal values;

a subtraction unit for receiving time-delayed digital signal values from said memory and for subtracting time-delayed digital signal values from digital signal values; and a digital-to-analog (D/A) converter coupled to said subtraction unit; and an amplifier, coupled to the suppression unit, to amplify the noiseless output signal;

said suppression unit being arranged for receiving the input signal and for providing a time-delayed signal of the input signal and to subtract the time-delayed signal from the input signal, the time-delayed signal being delayed by a delay period substantially equal to the inverse of the noise frequency to be suppressed or an integer multiple thereof, and said subtraction unit being part of a central processing unit (CPU) or its functions being performed by said CPU and said CPU being arranged for reading out digital signal values from said memory after a storage time, said storage time being identical with said delay time, and for subtracting these time-delayed digital signal values from actual input digital signal values.

2. A capacitive amplifier according to claim 1, further including a high pass filter coupled to said input terminal.

3. A capacitive amplifier according to claim 2, wherein said high pass filter is comprised of a differential amplifier, wherein a positive input port of said differential amplifier is coupled to said input terminal and a negative input port of said differential amplifier is coupled to an output of a low pass filter and an input of said low pass filter is coupled to said input port.

4. A capacitive amplifier according to claim 3, wherein said low pass filter has a cut-off frequency of about 300 Hz.

5. A capacitive amplifier according to claim 2, wherein said high pass filter is part of a preamplifier stage comprising a preamplifier and said high pass filter.

6. A capacitive amplifier according to claim 1, wherein said probe includes a probe tip having an electrically non-conductive or high-resistive surface.

7. A capacitive amplifier according to claim 6, wherein said probe tip is made of carbon fiber material or from anodized aluminum.

8. A tone generator for use in conjunction with a capacitive amplifier according to claim 1, comprising a 4-position slide switch to select between the modes square wave, sine wave, continuity and talking mode, wherein in the square wave mode a tone signal is output as a square wave signal, in the sine wave mode a tone signal is output as a sine wave signal, in the continuity mode the continuity of any conductor, circuit or electronic part can be tested, and in the talking mode a specific DC voltage can be delivered.

9. A capacitive amplifier for detecting and amplifying an electrical tone conducted by one of a group of wires in order to identify and trace a particular wire, the capacitive amplifier suppressing noise signals having a predetermined fundamental noise frequency and suppressing noise signals having frequencies that are harmonics of said predetermined fundamental noise frequency, said capacitive amplifier comprising:

a probe placed adjacent a wire under test;

an input terminal, coupled to the conductive probe, to receive an input signal therefrom;

a suppression unit, coupled to the input terminal, to receive the input signal and to suppress said noise signals;

an amplifier, coupled to the suppression unit, to amplify the noiseless output signal; and a volume tuning section coupled to said input terminal, said volume tuning section comprising a digital potentiometer and a push button section to switch on said capacitive amplifier and to actuate said digital potentiometer, wherein said push button section comprises a push button and three electrical contacts arranged in a line such that by pressing the push button the middle contact is actuated and said capacitive amplifier is thereby switched on and by shifting the pressed push button in the forward or the backward direction the front or the back contact is additionally actuated and the digital potentiometer is thereby controlled to increase or to reduce the signal level.

10. A capacitive amplifier according to claim 9, wherein said probe includes a probe tip having an electrically non-conductive or high resistive surface.

11. A capacitive amplifier according to claim 10, wherein said probe tip is made of carbon fiber material or from anodized aluminum.

* * * * *